(12) United States Patent
MacDonald et al.

(10) Patent No.: US 6,181,267 B1
(45) Date of Patent: Jan. 30, 2001

(54) INTERNALLY TRIGGERED EQUIVALENT-TIME SAMPLING SYSTEM FOR SIGNALS HAVING A PREDETERMINED DATA RATE

(75) Inventors: Willard MacDonald, San Francisco; Mark J. Woodward; Stephen W. Hinch, both of Santa Rosa, all of CA (US)

(73) Assignee: Agilent Technologies Inc., Palo Alto, CA (US)

(*) Notice: Under 35 U.S.C. 154(b), the term of this patent shall be extended for 0 days.

(21) Appl. No.: 09/163,811

(22) Filed: Sep. 30, 1998

(51) Int. Cl.[7] .................................................. H03M 1/12
(52) U.S. Cl. ............................................. 341/155; 341/61
(58) Field of Search .............................. 341/155, 61, 122, 341/120

(56) References Cited

U.S. PATENT DOCUMENTS

| | | |
|---|---|---|
| 4,678,345 | 7/1987 | Agoston . |
| 4,812,769 | 3/1989 | Agoston . |
| 5,315,627 | 5/1994 | Draving . |
| 5,631,553 * | 5/1997 | Bose et al. ............................ 341/155 |
| 5,684,837 * | 11/1997 | Chen ..................................... 341/155 |

* cited by examiner

*Primary Examiner*—Michael Tokar
*Assistant Examiner*—Jean Bruner Jeanglaude
(74) *Attorney, Agent, or Firm*—John L. Imperato

(57) ABSTRACT

An internally triggered equivalent-time sampling system characterizes high-speed data signals having a predetermined nominal data rate by using an internal oscillator that runs independent of a synchronous trigger signal. The sampling system acquires samples of the data signal at a strobe rate, set by the oscillator, which is lower than the nominal data rate of the data signal. The samples, the strobe rate, and the nominal data rate are communicated to a quality optimizer which compensates for static rate deviations between the nominal data rate and the actual data rate of the data signal to establish timing correspondence between the acquired samples. The timing correspondence establishes the time placement of the acquired samples when characterizing the data signal on a display or other output device. When the oscillator has high timing stability relative to the data signal, jitter and other attributes of the data signal are accurately characterized.

13 Claims, 2 Drawing Sheets

INTERNALLY TRIGGERED EQUIVALENT-TIME SAMPLING SYSTEM FOR SIGNALS HAVING A PREDETERMINED DATA RATE

BACKGROUND OF THE INVENTION

Equivalent-time sampling systems are used to characterize and display high-speed data signals. An equivalent-time sampling system disclosed by Agoston in U.S. Pat. No. 4,812,769 relies on a trigger signal that is synchronous with the data signal to provide trigger events used for acquiring samples of the data signal. The timing of the acquired samples is progressively varied relative to the trigger events until the number of samples is sufficient to reconstruct the waveform of the data signal on a display. However, a synchronous trigger signal may not be available in optical fiber networks or other communication networks, making it difficult to characterize high-speed data signals within these networks using this type of equivalent-time sampling system. In U.S. Pat. No. 4,678,345, Agoston discloses an equivalent-time pseudorandom sampling system that does not rely on a synchronous trigger signal. Trigger events in this system are provided by the data signal. Time intervals between the trigger events on the data signal establish the relative timing of acquired samples. It is difficult to isolate characteristics of the data signal such as jitter or other timing instabilities using this type of sampling system since timing of sample acquisitions is derived directly from the data signal itself. For example, jitter in the data signal may be masked or enhanced by the equivalent-time pseudorandom sampling system, depending on how the system processes the trigger events. Accordingly, there is a need for a sampling system capable of characterizing a high-speed data signal that does not rely on a synchronous trigger signal and that does not derive the timing of sample acquisitions directly from the data signal.

SUMMARY OF THE INVENTION

According to the preferred embodiment of the present invention, an internally triggered equivalent-time sampling system characterizes high-speed data signals having a predetermined nominal data rate by using an internal oscillator that runs independent of a synchronous trigger signal. The sampling system acquires samples of the data signal at a strobe rate, set by the oscillator, which is lower than the nominal data rate of the data signal. The samples, the strobe rate, and the nominal data rate are communicated to a quality optimizer which compensates for static rate deviations between the nominal data rate and the actual data rate of the data signal to establish timing correspondence between the acquired samples. The timing correspondence establishes the time placement of the acquired samples when characterizing the data signal on a display or other output device. When the oscillator has high timing stability relative to the data signal, jitter and other timing instabilities of the data signal are isolated so that attributes of the data signal are accurately characterized by the sampling system.

DETAILED DESCRIPTION OF THE PREFERRED EMBODIMENT

Figure 1:
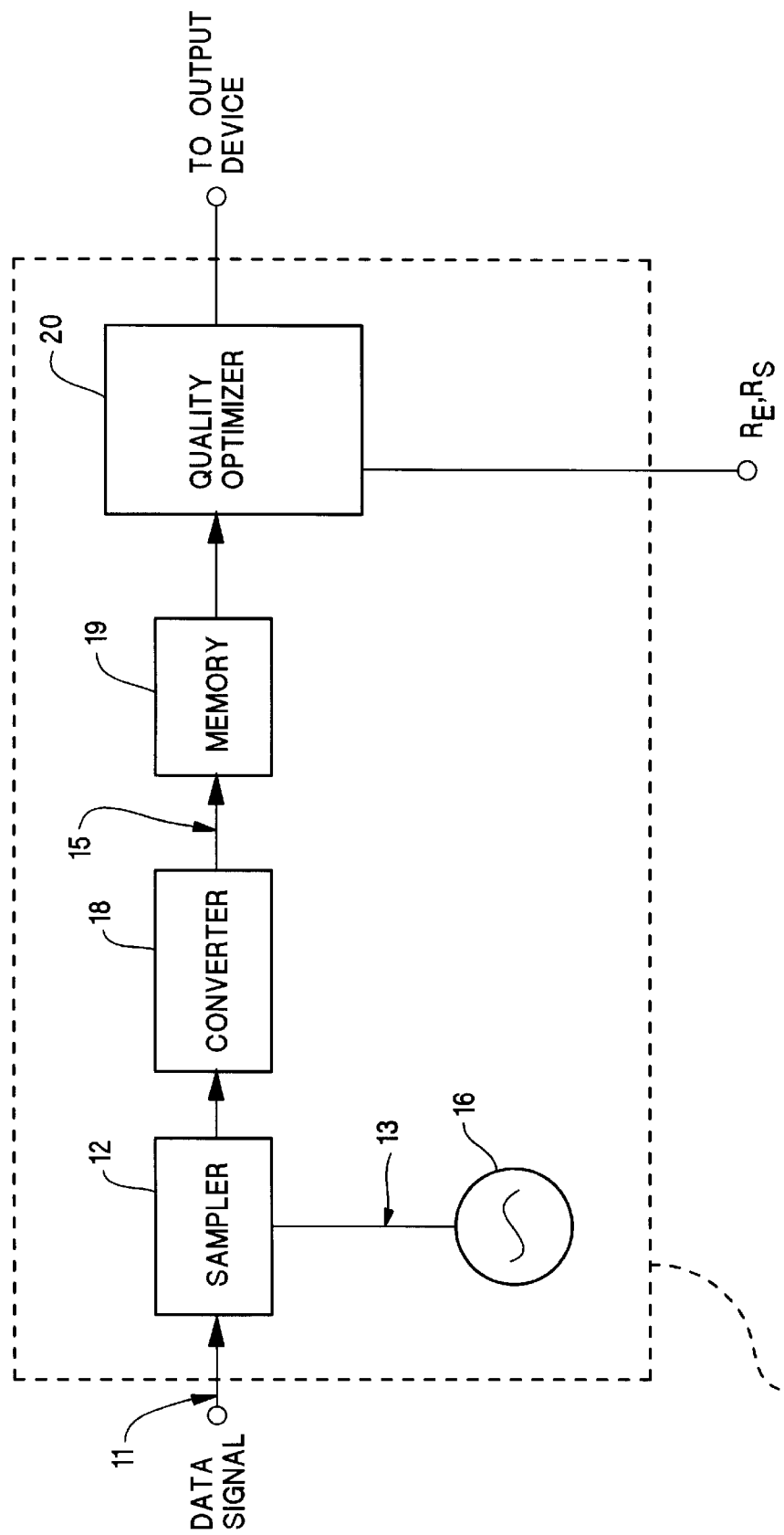
FIG. 1 shows an internally triggered equivalent-time sampling system constructed according to the preferred embodiment of the present invention.

FIG. 1 shows the internally triggered equivalent-time sampling system 10 constructed according to the preferred embodiment of the present invention. Typically, the sampling system 10 is incorporated within an oscilloscope or other measurement instrument. A high-speed data signal 11 is applied to a sampler 12 that is driven by a strobe signal 13 provided by an oscillator 16. When the data signal 11 is provided by an optical fiber network or other communication network, a trigger signal, synchronous with the data signal 11, is not always available to the sampling system 10. The oscillator 16 does not rely upon the presence of such a synchronous trigger signal and runs independent of the applied data signal 11.

The sampler 12 acquires samples of the applied data signal 11 at time intervals determined by a strobe rate $R_S$ of the strobe signal 13. An analog-to-digital (A/D) converter 18 coupled to the output of the sampler 12 digitizes the samples to produce sample points 15. A quality optimizer 20 receives the sample points 15 directly from the A/D converter 18, or alternatively, from a memory 19, such as a FIFO, as shown. The quality optimizer 20 is implemented within a central processing unit CPU (not shown) associated with the sampling system 10 or is implemented using a digital signal processor or other type of processor. The quality optimizer 20 derives a timing correspondence between sample points 15 and drives a display or other output device (not shown) used to reconstruct segments of the data signal 11.

The data signal 11 applied to the sampling system 10 has a nominal data rate $R_E$ that is communicated to the quality optimizer 20. In one example, the data signal 11 is supplied by a communication network, such as a SONET (synchronous optical network) OC48 which has a nominal data rate $R_E$ of 2.48832 Gigabits per second, and the nominal data rate $R_E$ is the standard data rate specified within the network. Generally, the nominal data rate $R_E$ is a predetermined rate that is provided to the quality optimizer 20 by a user of the sampling system 10, or alternatively, is preset within the quality optimizer 20.

Typically, the nominal data rate $R_E$ of the data signal 11 is substantially higher than the maximum operating rate of the sampler 12, and the strobe rate $R_S$ is substantially lower than the nominal data rate $R_E$. The strobe rate $R_S$ set by the oscillator 16 is communicated to the quality optimizer 20 and is chosen so that integer multiples of the strobe rate $R_S$ are offset from the nominal data rate $R_E$. The timing resolution of the acquired sample points 15 increases as the offset decreases. The offset assures that the timing of acquisitions of the sample points 15 progressively varies relative to cycles of the data signal 11 to provide for equivalent-time sampling of the data signal 11. However, it is difficult to reconstruct segments of the waveform of the data signal 11 using known equivalent-time sampling techniques because the data signal 11 has an actual data rate $R_D$ that differs from the nominal data rate $R_E$ by an unknown rate deviation. This difference between the actual data rate $R_D$ and the nominal data rate $R_E$ typically has a static rate deviation and time-varying rate deviations. The static rate deviation includes fixed rate shifts or rate offsets between the actual data rate $R_D$ and the nominal data rate $R_E$, whereas the time-varying rate deviation includes jitter and other timing instabilities of the data signal 11. When characterizing the data signal 11, it is often desirable to isolate and display jitter and the other timing instabilities, while compensating to suppress the effects of static rate deviations.

The quality optimizer 20 compensates for the static rate deviations between the actual data rate $R_D$ and the nominal data rate $R_E$ to derive the timing correspondence between the sample points 15. When the timing stability of the oscillator 16 is sufficiently high, the strobe signal 13 has high timing stability relative to the timing stability of the data signal 11, enabling the jitter and other timing instabilities of the data signal 11 to be isolated so that attributes of the data signal 11 can be accurately characterized by the sampling system 10.

Figure 2:
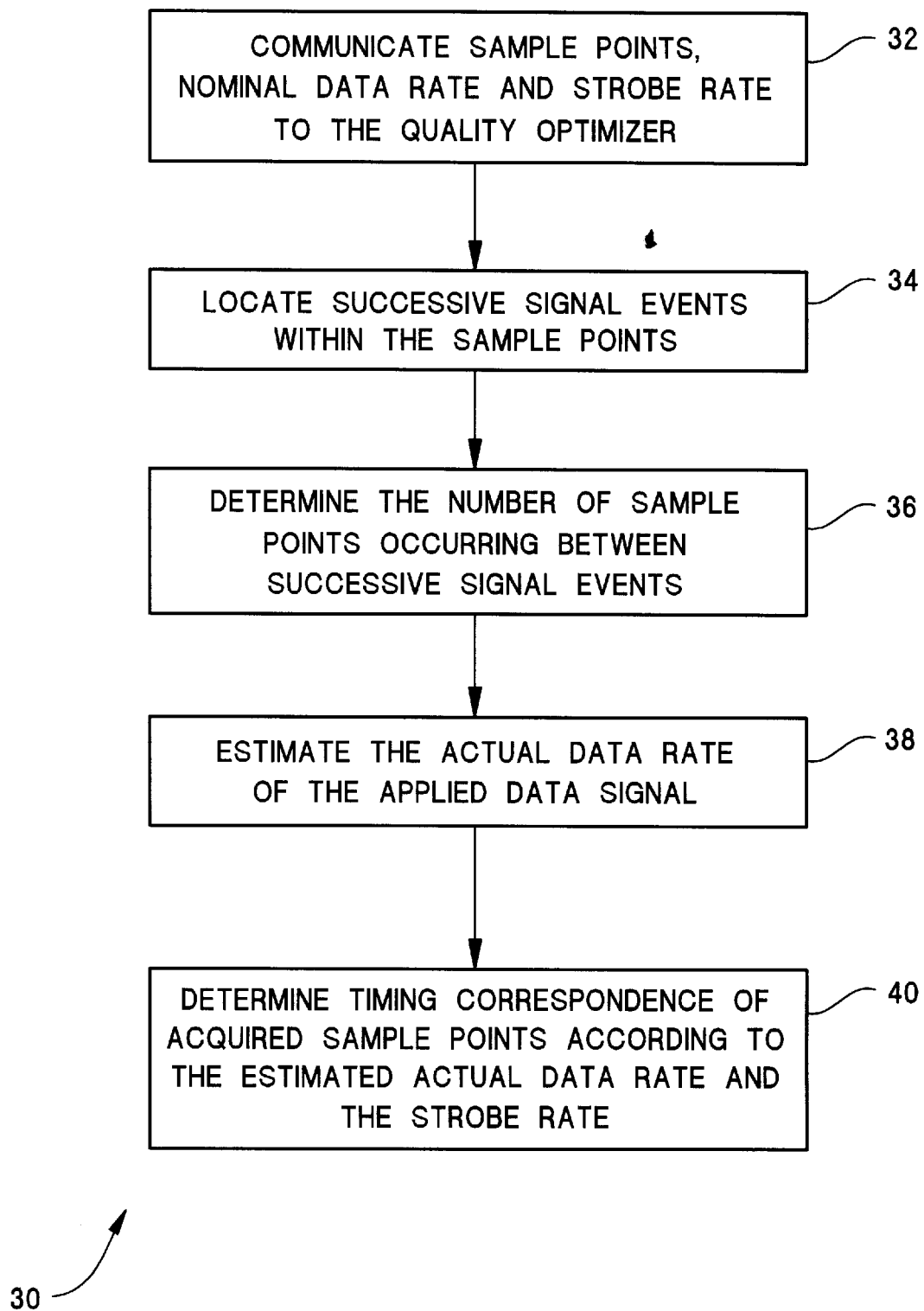
FIG. 2 shows a compensation scheme used by a quality optimizer included within the internally triggered equivalent-time sampling system of FIG. 1.

FIG. 2 shows a scheme 30 used by the quality optimizer 20 to compensate for static rate deviations between the nominal data rate $R_E$ and the actual data rate $R_D$ of the data signal 11 and to derive timing correspondence between the sample points 15. In step 32, the sample points 15, the nominal data rate $R_E$ and the strobe rate $R_S$ are communicated to the quality optimizer 20. When the static rate deviation between the nominal data rate $R_E$ and the actual data rate $R_D$ is too large, the acquired sample points 15 are insufficiently spaced to accurately reconstruct segments of the data signal 11. Generally, the accuracy and timing resolution of the reconstructed segments of the data signal 11 are improved as the static rate deviation, or rate offset, between the nominal data rate $R_E$ and the actual data rate $R_D$ decreases. Thus, the more closely the nominal data rate $R_E$ is set to the actual data rate $R_D$, the greater the achievable accuracy and timing resolution.

In steps 34–40, the timing correspondence between the acquired sample points 15 is established based on analysis of the acquired sample points 15, the nominal data rate $R_E$, the strobe rate $R_S$ and an estimate $R'_D$ of the actual data rate $R_D$. In step 34, the acquired sample points 15 are analyzed to locate successive signal events within the acquired samples 15. The signal events are predefined characteristics within the sample points 15 such as predetermined amplitude levels, or rising or falling edge transitions detectable within the sample points 15. In this example the successive signal events are a rising edge followed by a falling edge transition detectable within the sample points, or alternatively, the successive signal events are a falling edge followed by a rising edge transition detectable within the sample points. Interpolation between data points 15, binary searching or other searching techniques are used to accurately locate the successive signal events when the events occur between sample points 15. While signal events may occur at various spacings within the acquired sample points 15, for example when the data signal 11 is a random or pseudorandom bit stream, the successive signal events correspond to the closest spaced signal events within the sample points 15 and are sought in step 34.

Once the successive signal events are located within the acquired sample points 15, a number M, which includes both the integer number of sample points counted between the successive signal events and a fractional portion resulting from the interpolation or searching between sample points 15 for the successive signal events, is determined in step 36. As an alternative to counting the number of sample points 15 between successive signal events and searching between sample points for the successive signal events, M is determined by locating non-successive signal events within the sample points 15, counting the integer number and fractional portion of sample points between the non-successive events and dividing this result by the equivalent number of successive signal events occurring between the non-successive signal events.

Based on the determined number M, the nominal data rate $R_E$ and the strobe rate $R_S$, the static rate deviation between the nominal data rate $R_E$ and the actual data rate $R_D$ is compensated. In step 38, the compensation is achieved by performing an estimate $R'_D$ of the actual data rate $R_D$ according to the relationship:

$$R'_D = \{M^* \text{FLOOR}(R_E/R_S) + 1\}/\{M^* \text{MOD}(R_E/R_S) + (M/R_E)^* \text{FLOOR}(R_E/R_S)\}$$

where FLOOR indicates the integer portion of the expression in parentheses following the FLOOR and where MOD indicates the fractional portion of the ratio in parentheses following the MOD. The timing correspondence between sample points 15 is then determined in step 40. The timing correspondence involves determining the time placement of acquired sample points 15. This time placement is used to reconstruct segments of the data signal 11 on a display or output device. In this example, the time placement of the Nth acquired sample point 15 equals $\text{MOD}(N^* R'_D/R_S)$.

While the preferred embodiment of the present invention has been illustrated in detail, it should be apparent that modifications and adaptations to this embodiment may occur to one skilled in the art without departing from the scope of the present invention as set forth in the following claims.

What is claimed is:

1. A sampling system for characterizing an applied data signal having a nominal data rate and an actual data rate, comprising:

a sampler receiving the data signal, acquiring samples of the data signal and providing the samples of the data signal;

an oscillator coupled to the sampler, independent of the data signal and designating a strobe rate at which the samples are acquired, where the strobe rate is lower than the nominal data rate of the data signal;

a converter coupled to the sampler, digitizing the acquired samples to produce sample points;

a quality optimizer receiving the sample points, the strobe rate and the nominal data rate and determining a timing correspondence between sample points.

2. The sampling system of claim 1 wherein the quality optimizer determines the timing correspondence between sample points by compensating for static rate deviations between the nominal data rate and the actual data rate of the applied data signal.

3. The sampling system of claim 2 further comprising a memory coupled between the converter and the quality optimizer, receiving the sample points from the converter and providing the sample points to the quality optimizer.

4. The sampling system of claim 2 wherein compensating for static rate deviations includes determining the number of sample points occurring between successive signal events within the sample points, estimating the actual data rate according to the determined number of sample points, the strobe rate and the nominal data rate, and establishing a time placement of sample points according to the estimated actual data rate and the strobe rate.

5. The sampling system of claim 4 wherein the signal events include at least one of a rising edge transition detected within the sample points, a falling edge transition detected within the sample points, and a predetermined amplitude level detected within the sample points.

6. The sampling system of claim 4 wherein the time placement of sample points is the fractional remainder of an integer multiple of the ratio of the estimated actual data rate and the strobe rate.

7. The sampling system of claim 6 wherein the estimated actual data rate includes the product of the number of sample points occurring between successive signal events and the integer portion of the ratio of the nominal data rate to the strobe rate, divided by the sum, of the product of the number of sample points occurring between successive signal events and the fractional remainder of the ratio of the nominal data rate and the strobe rate, and the ratio of the number of sample points occurring between successive signal events to the nominal data rate times the integer portion of the ratio of the nominal data rate to the strobe rate.

8. A sampling method for characterizing an applied data signal having a nominal data rate and an actual data rate, comprising the steps of:
   acquiring samples of the data signal at a strobe rate that is asynchronous with the applied data signal and that is lower than the nominal data rate;
   digitizing the acquired samples to produce sample points; and
   determining a timing correspondence between sample points based on the sample points, the strobe rate and the nominal data rate.

9. The sampling method of claim 8 wherein the step of determining the timing correspondence between sample points includes compensating for static rate deviations between the nominal data rate and the actual data rate of the applied data signal.

10. The sampling method of claim 9 wherein compensating for static rate deviations includes determining the number of sample points occurring between successive signal events within the sample points, estimating the actual data rate according to the determined number of sample points, the strobe rate and the nominal data rate, and establishing a time placement of sample points according to the estimated actual data rate and the strobe rate.

11. The sampling method of claim 10, wherein establishing a time placement of sample points includes placing sample points at times equal to the fractional remainder of an integer multiple of the ratio of the estimated actual data rate and the strobe rate.

12. The sampling method of claim 11 wherein estimating the actual data rate includes determining the product of the number of sample points occurring between successive signal events and the integer portion of the ratio of the nominal data rate to the strobe rate, divided by the sum, of the product of the number of sample points occurring between successive signal events and the fractional remainder of the ratio of the nominal data rate and the strobe rate, and the ratio of the number of sample points occurring between successive signal events to the nominal data rate times the integer portion of the ratio of the nominal data rate to the strobe rate.

13. The sampling method of claim 10 wherein determining the number of sample points occurring between successive signal events within the sample points includes determining the number of sample points occurring between at least one of a rising edge transition detected within the sample points, a falling edge transition detected within the sample points, and a predetermined amplitude level detected within the sample points.

* * * * *